United States Patent
Park et al.

(10) Patent No.: US 6,852,597 B2
(45) Date of Patent: Feb. 8, 2005

(54) METHOD FOR FABRICATING POWER SEMICONDUCTOR DEVICE HAVING TRENCH GATE STRUCTURE

(75) Inventors: Il-Yong Park, Pyungtaek (KR); Jong Dae Kim, Daejon (KR); Sang Gi Kim, Daejon (KR); Jin Gun Koo, Daejon (KR); Dae Woo Lee, Daejon (KR); Roh Tae Moon, Daejon (KR); Yang Yil Suk, Daejon (KR)

(73) Assignee: Electronics and Telecommunications Research Institute (KR)

( * ) Notice: Subject to any disclaimer, the term of this patent is extended or adjusted under 35 U.S.C. 154(b) by 548 days.

(21) Appl. No.: 10/071,127

(22) Filed: Feb. 8, 2002

(65) Prior Publication Data

US 2003/0068864 A1 Apr. 10, 2003

(30) Foreign Application Priority Data

Oct. 10, 2001 (KR) .............................................. 01-62350

(51) Int. Cl.$^7$ ............................................ H01L 21/336
(52) U.S. Cl. ...................... 438/268; 438/270; 438/589; 438/696; 438/700; 257/329; 257/330; 257/332
(58) Field of Search ................................ 257/328–330, 257/332; 438/212, 268, 270, 272, 696, 700

(56) References Cited

U.S. PATENT DOCUMENTS 5,100,823 A  *  3/1992  Yamada ...................... 438/243
5,567,634 A     10/1996  Hebert et al. ................. 437/41

(List continued on next page.)

OTHER PUBLICATIONS

IEEE 2000, "A 0.03um Trench Gate MOSFET with an ultra low on state resistance and a high destruction immunity during the inductive switching", A. Narazaki, et al., 3 pages.

(List continued on next page.)

Primary Examiner—Amir Zarabian
Assistant Examiner—Toniae M. Thomas
(74) Attorney, Agent, or Firm—Blakely Sokoloff Taylor & Zafman

(57) ABSTRACT

A method for fabricating a power semiconductor device having a trench gate structure is provided. An epitaxial layer of a first conductivity type having a low concentration and a body region of a second conductivity type are sequentially formed on a semiconductor substrate of the first conductivity type having a high concentration. An oxide layer pattern is formed on the body region. A first trench is formed using the oxide layer pattern as an etching mask to perforate a predetermined portion of the body region having a first thickness. A body contact region of the second conductivity type having a high concentration is formed to surround the first trench by impurity ion implantation using the oxide layer pattern as an ion implantation mask. First spacer layers are formed to cover the sidewalls of the first trench and the sidewalls of the oxide layer pattern. A second trench is formed using the oxide layer pattern and the first spacer layers as etching masks to perforate a predetermined portion of the body region having a second thickness greater than the first thickness. A source region of the first conductivity type having a high concentration is formed to surround the second trench by impurity ion implantation using the oxide layer pattern and the first spacer layers as ion implantation masks. Second spacer layers are formed to cover the sidewalls of the second trench and the sidewalls of the first spacer layers. A third trench is formed to a predetermined depth of the epitaxial layer using the oxide layer pattern, the first spacer layers, and the second spacer layers as etching masks. A gate insulating layer is formed in the third trench. A gate conductive pattern is formed in the gate insulating layer. An oxide layer is formed on the gate conductive layer pattern. The first and second spacer layers are removed. A first metal electrode layer is formed to be electrically connected to the source region and the body contact region. A second metal electrode layer is formed to be electrically connected to the gate conductive layer pattern. A third metal electrode layer is formed to be electrically connected to the semiconductor substrate.

9 Claims, 10 Drawing Sheets

U.S. PATENT DOCUMENTS

| | | | | |
|---|---|---|---|---|
| 5,648,670 | A | * 7/1997 | Blanchard | 257/329 |
| 5,665,619 | A | 9/1997 | Kwan et al. | 438/270 |
| 5,689,128 | A | 11/1997 | Hshieh et al. | 257/331 |
| 5,891,776 | A | * 4/1999 | Han et al. | 438/274 |
| 5,970,344 | A | 10/1999 | Kubo et al. | 438/270 |
| 6,238,981 | B1 | 5/2001 | Grebs | 438/272 |
| 6,252,277 | B1 | * 6/2001 | Chan et al. | 257/330 |
| 6,316,807 | B1 | * 11/2001 | Fujishima et al. | 257/333 |
| 6,433,385 | B1 | * 8/2002 | Kocon et al. | 438/270 |
| 2001/0038121 | A1 | * 11/2001 | Kim et al. | 257/330 |
| 2004/0166637 | A1 | * 8/2004 | Ito et al. | 438/270 |

OTHER PUBLICATIONS

IEEE 1999, "2.5V–Driven Nch 3rd Generation Trench Gate MOSFET", A Osawa, et al., 4 pages.

2001 International Symposium on Power Semiconductor Devices ICs, "An ultra Dense Trench–Gated Power MOSFET Technology Using a Self–Aligned Process", J. Zeng, et al., 4 pages.

2001 Elsevier Science, Journal of Alloys and Compounds 323–324, "The blue–phosphor Sr2CeO4 synthesized by Pechini's method", O.A. Serra, et al., 3 pages.

2001 International Symposium on Power Semiconductor Devices ICs, "Recessed Trench MOSFET Process Without Critical Alignments Makes Very High Densities Possible", A. Finney, et al., 4 pages.

2001 Elsevier Science Ltd., "A process simplification scheme for fabricating self–aligned silicided trench–gate power MOSFETs", M. Juang, 4 pages.

IEEE 2000, "High–Density Low On–Resistance Trench MOSFETs Employing Oxide Spacers and Self–Align Technique for DC/DC Converter", J. Kim, et al., 4 pages.

* cited by examiner

METHOD FOR FABRICATING POWER SEMICONDUCTOR DEVICE HAVING TRENCH GATE STRUCTURE

BACKGROUND OF THE INVENTION

1. Field of the Invention

The present invention relates to a method for fabricating a power semiconductor device, and more particularly, to a method for fabricating a power semiconductor device having a trench gate structure

2. Description of the Related Art

Recently, power semiconductor devices having a trench gate structure have been widely used. Since the power semiconductor devices employ a trench gate structure, it is possible to prevent a junction field effect transistor (JFET) effect that may occur in a conventional planar structure and decrease the ON-resistance of the power semiconductor devices by decreasing the width of each cell and thus increasing the integration density of the power semiconductor devices. It is not difficult to manufacture a trench having a width of no greater than 1 µm in consideration of a current technological level. However, since the size of a source region and a body region is dependent on the size of openings for a source contact and a body contact, alignment margins approximately reach 2–5 µm in consideration of a current lithographic technology. In order to decrease the size of openings for a source contact and a body contact, various methods have been suggested.

FIGS. 1A through 1F are cross-sectional views illustrating a method for fabricating a power semiconductor device having a conventional trench gate structure. As shown in FIG. 1A, an $n^-$-type epitaxial layer 102 is formed on an $n^+$-type silicon substrate 100. A pad oxide layer 104, a nitride layer 106, and a low temperature oxide layer 108 are sequentially and thinly formed on the $n^-$-type epitaxial layer 102. Next, as shown in FIG. 1B, the low temperature oxide layer 108, the nitride layer 106, the pad oxide layer 104, and the silicon substrate 100 are sequentially etched to a predetermined depth of the silicon substrate 100 using a predetermined mask layer pattern, for example, a photoresist layer pattern (not shown), to form a trench 110. Next, the photoresist layer pattern is removed. Next, as shown in FIG. 1C, a gate insulating layer 112 is formed along the surface of the trench 110, and a gate conductive layer 114 is formed to completely fill the trench 110. Next, as shown in FIG. 1D, the gate conductive layer 114 is etched back to be level with the top surface of the silicon wafer 100, and then an oxide layer 116 is formed on the gate conductive layer 114. Next, p-type impurity ions are implanted using the oxide layer 116 as an ion implantation mask to diffuse into the silicon wafer 100, thereby forming a $p^-$-type body region 118. Next, $n^+$-type impurity ions are implanted using a predetermined mask layer pattern (not shown) and the oxide layer 116 to diffuse into the silicon wafer 100, thereby forming an $n^+$-type source region 120. Next, the mask layer pattern is removed. Next, as shown in FIG. 1E, spacer layers 122 are formed at the sidewalls of the oxide layer 116. P+-type impurity ions are implanted using the spacer layers 122 and the oxide layer 116 as ion implantation masks to diffuse into the silicon wafer 100, thereby forming a $p^+$-type body contact region 124. Next, as shown in FIG. 1F, the top surfaces of the n+-type source region 120 and the p+-type body contact region 124 are exposed, and then a metal layer is deposited on the silicon wafer 100, thereby forming a source electrode 126. Next, a metal layer (not shown) is deposited at the bottom surface of the silicon substrate 100, thereby forming a drain electrode (not shown).

In the method for fabricating a power semiconductor device, since a source region and a body contact region are formed in a self-alignment manner, a smaller number of masks (five masks) are required in the manufacture of a power semiconductor device. In addition, according to the above method, it is possible to increase the integration density of cells and improve the current driving capability and ON-resistance characteristics of a power semiconductor device. However, as the size of cells of a power semiconductor devices decreases, the integration density of the cells continues to increase considerably. In addition, there is a limit in decreasing the width of cells due to restrictions on the width of the spacer layers 122 and the lengths of the $n^+$-type source region 120 and the $p^+$-type body contact region 124.

SUMMARY OF THE INVENTION

To solve the above-described problems, it is an object of the present invention to provide a method for fabricating a power semiconductor device having a trench gate structure which is capable of increasing the integration density of cells by decreasing the lengths of a source region and a body contact region using a small number of masks.

Accordingly, to achieve the above object, there is provided a method for fabricating a power semiconductor device. An epitaxial layer of a first conductivity type having a low concentration and a body region of a second conductivity type are sequentially formed on a semiconductor substrate of the first conductivity type having a high concentration. An oxide layer pattern is formed on the body region. A first trench is formed using the oxide layer pattern as an etching mask to perforate a predetermined portion of the body region having a first thickness. A body contact region of the second conductivity type having a high concentration is formed to surround the first trench by impurity ion implantation using the oxide layer pattern as an ion implantation mask. First spacer layers are formed to cover the sidewalls of the first trench and the sidewalls of the oxide layer pattern. A second trench is formed using the oxide layer pattern and the first spacer layers as etching masks to perforate a predetermined portion of the body region having a second thickness greater than the first thickness. A source region of the first conductivity type having a high concentration is formed to surround the second trench by impurity ion implantation using the oxide layer pattern and the first spacer layers as ion implantation masks. Second spacer layers are formed to cover the sidewalls of the second trench and the sidewalls of the first spacer layers. A third trench is formed to a predetermined depth of the epitaxial layer using the oxide layer pattern, the first spacer layers, and the second spacer layers as etching masks. A gate insulating layer is formed in the third trench. A gate conductive pattern is formed in the gate insulating layer. An oxide layer is formed on the gate conductive layer pattern. The first and second spacer layers are removed. A first metal electrode layer is formed to be electrically connected to the source region and the body contact region. A second metal electrode layer is formed to be electrically connected to the gate conductive layer pattern. A third metal electrode layer is formed to be electrically connected to the semiconductor substrate.

The silicon oxide layer pattern is preferably formed to a thickness of about 4500 Å at a temperature of about 1000° C.

Forming the first spacer layers preferably includes forming a material layer to cover the first trench and the silicon oxide layer pattern, and etching back the material layer.

Preferably, forming the second spacer layers includes forming a material layer to cover the second trench, the first spacer layers, and the silicon oxide layer pattern, and etching back the material layer.

The material layer used to form the first or second spacer layers may be a nitride layer. Preferably, the material layer used to form the first or second spacer layers is formed by low pressure chemical vapor deposition. Preferably, etching the material layer is performed by plasma ion etching.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

The present invention will now be described more fully with reference to the accompanying drawings, in which a preferred embodiment of the invention is shown. This invention may, however, be embodied in many different forms and should not be construed as being limited to the embodiment set forth herein.

Figure 1A:
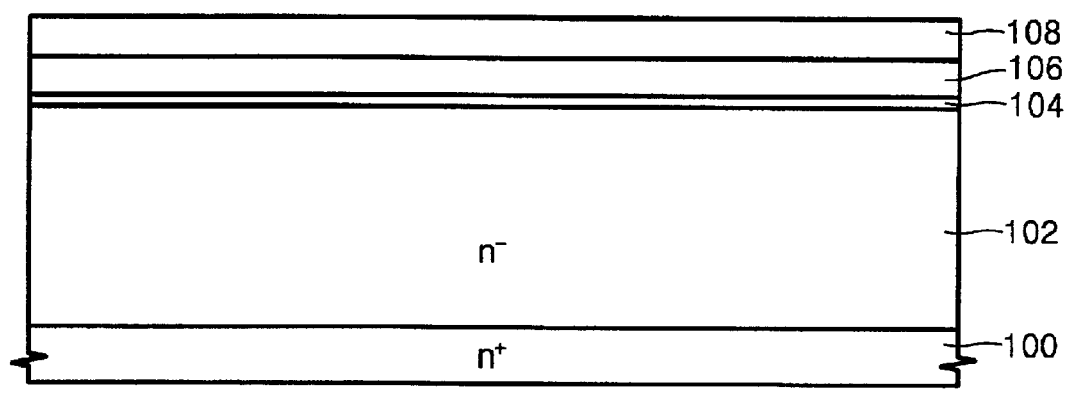
FIGS. 1A through 1F are cross-sectional views illustrating a method for fabricating a power semiconductor device having a conventional trench gate structure.
Figure 1B:
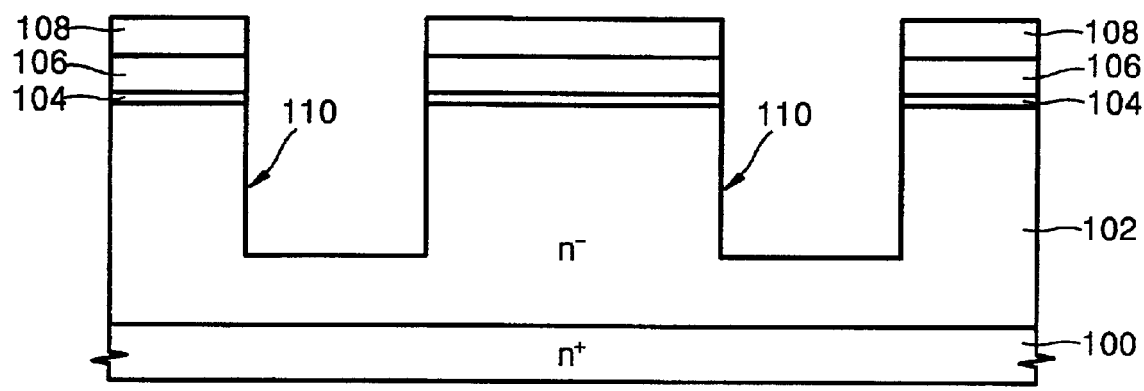
Figure 1C:
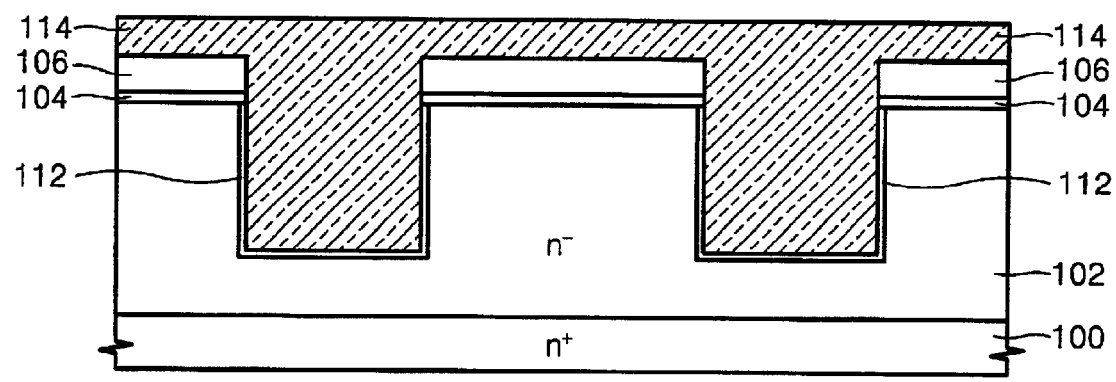
Figure 1D:
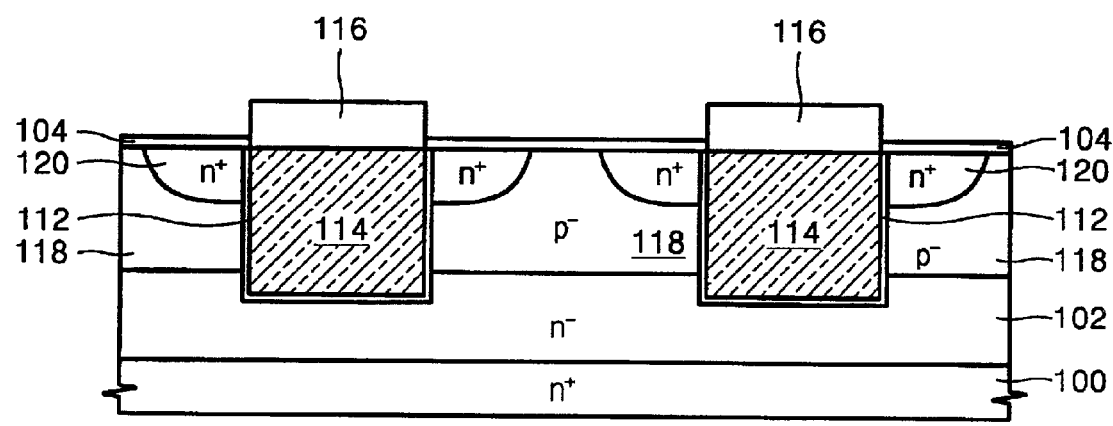
Figure 1E:
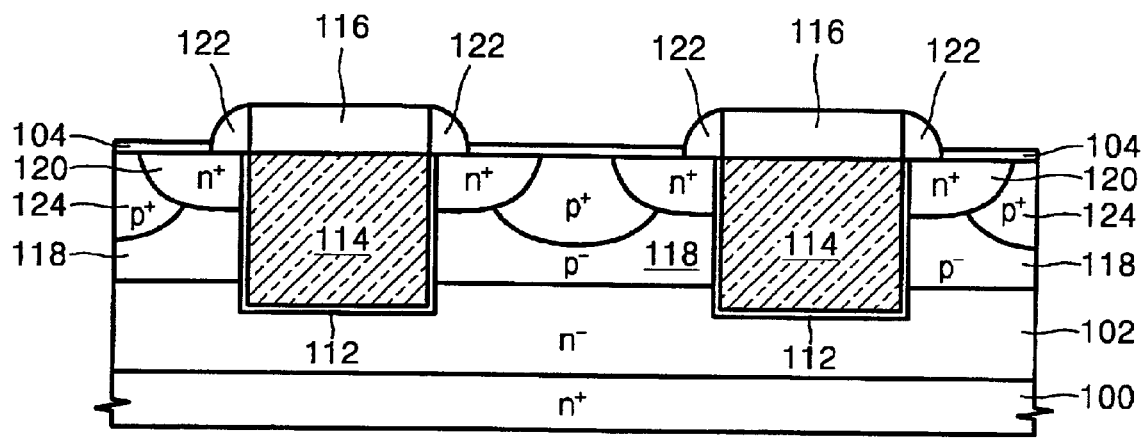
Figure 1F:
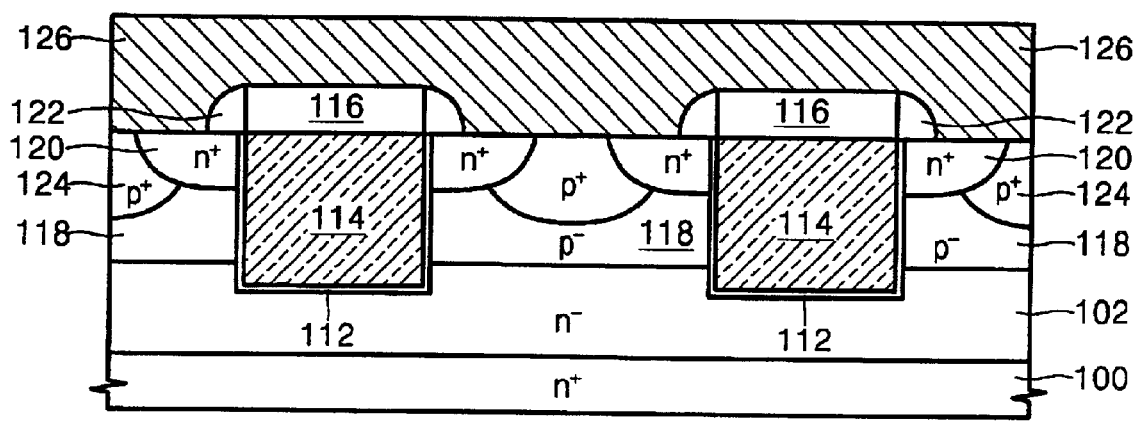
Figure 2A:
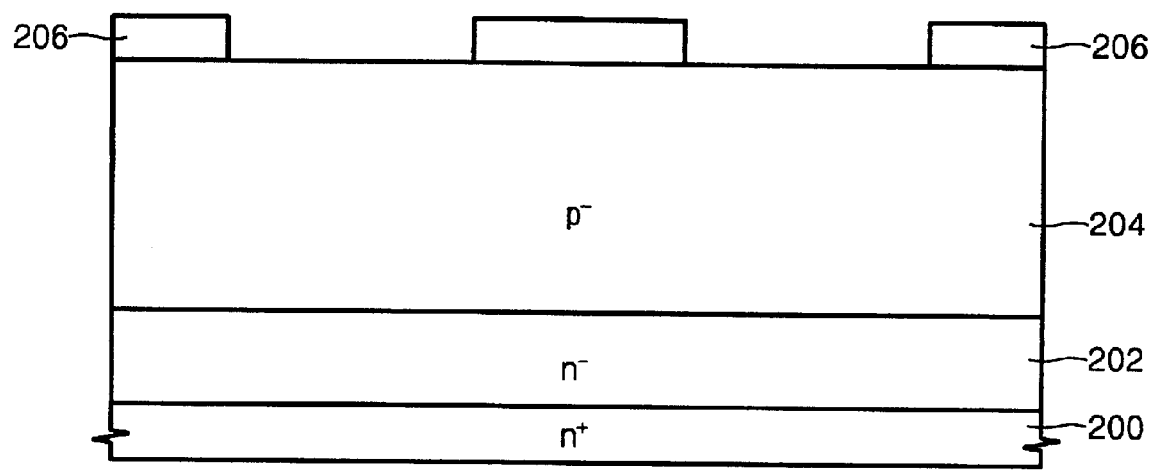
FIGS. 2A through 2J are cross-sectional views illustrating a method for fabricating a power semiconductor device having a trench gate structure according to the present invention.

FIGS. 2A through 2J are cross-sectional views illustrating a method for fabricating a power semiconductor device having a trench gate structure according to the present invention. Referring to FIG. 2A, an $n^-$-type epitaxial layer 202 is grown on an $n^+$-type semiconductor substrate, for example a silicon substrate 200. The $n^+$-type silicon substrate 200 has a resistivity of 2–4Ωcm and the $n^-$-type epitaxial layer 202 is formed to have a thickness of about 5 μm. Next, an oxide layer (not shown) is thinly formed on the $n^-$-type epitaxial layer 202. Next, $p^-$-type impurity ions, for example, $BF_2$ ions of a low concentration are implanted to diffuse into the silicon substrate 200, thereby forming a $p^-$-type body region 204 on the $n^-$type epitaxial layer 202. Next, the $p^-$-type body region 204 is thermally oxidized at a temperature of about 1000° C. to grow a silicon oxide layer to a thickness of about 4500 Å. Next, a silicon oxide layer pattern 206 is formed to partially expose the surface of the $p^-$-type body region 204 by patterning the silicon oxide layer using a first mask layer pattern (not shown).

Figure 2B:
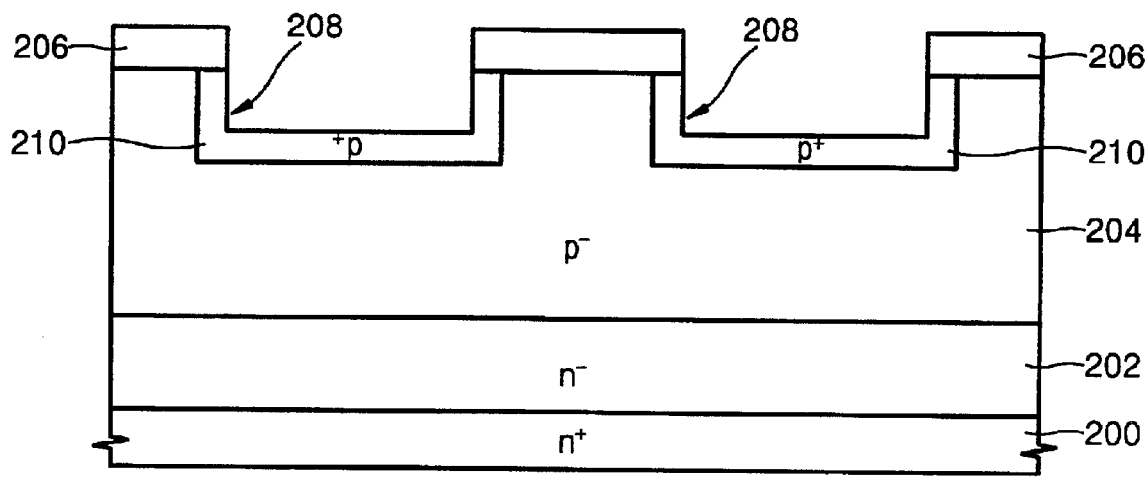

Referring to FIG. 2B, the $p^-$-type body region 204 is etched to a depth of about 0.5 μm using the silicon oxide layer pattern 206 as an etching mask to form a first trench 208. Next, $p^+$-type impurity ions, for example, $BF_2$ ions of a high concentration are implanted using the silicon oxide layer pattern 206 as an ion implantation mask to diffuse into the silicon substrate 200, thereby forming a $p^+$-type body contact region 210.

Figure 2C:
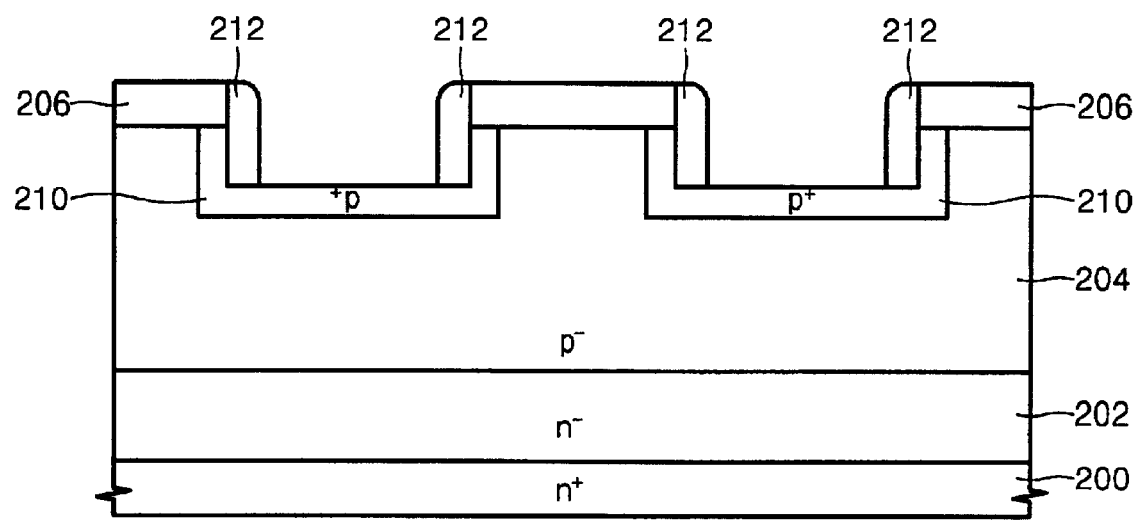

Referring to FIG. 2C, first spacer layers 212 are formed to cover the sidewalls of the first trench 208 and the sidewalls of the silicon oxide layer pattern 206. Forming the first spacer layers 212 involves forming a nitride layer on the entire surface of the silicon substrate 200 by low pressure chemical vapor deposition (LPCVD) and etching-back the nitride layer by plasma ion etching.

Figure 2D:
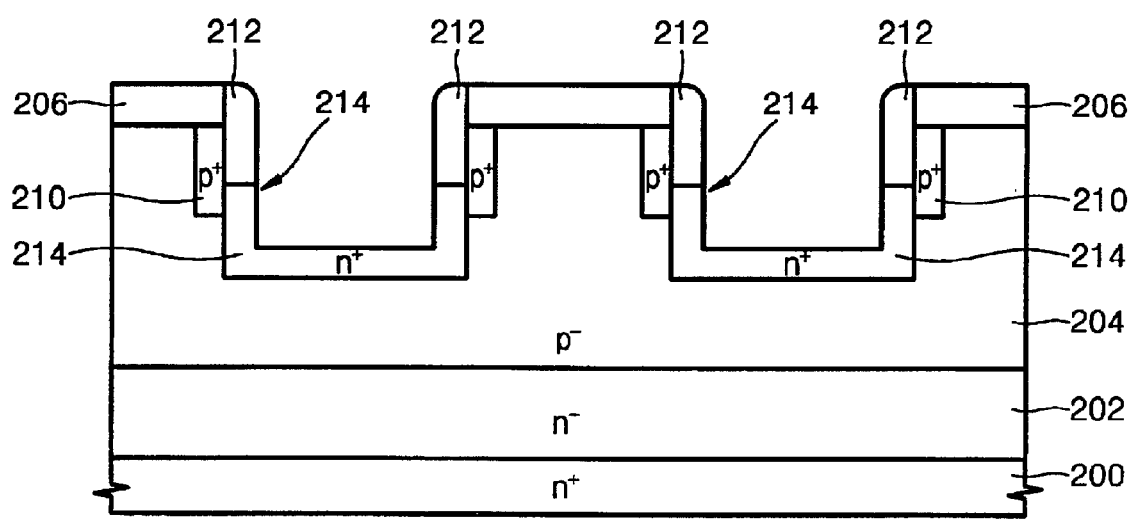

Referring to FIG. 2D, a second trench 214 is formed by etching the first trench 208 using the silicon oxide layer pattern 206 and the first spacer layers 212 as etching masks. The second trench 214 is formed to a sufficient depth to perforate the lower portion of the $p^+$-type body contact region 204. Next, $n^+$-type impurity ions, for example, arsenic (As) ions of a high concentration are implanted to diffuse into the silicon substrate 200, thereby forming an $n^+$-type source region 214.

Figure 2E:
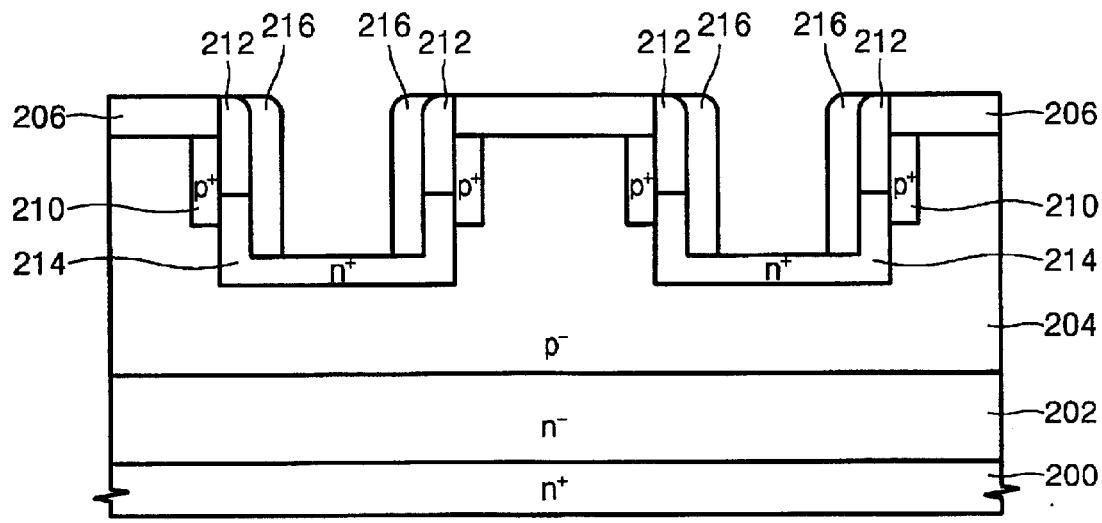

Referring to FIG. 2E, second spacer layers 216 are formed to cover the sidewalls of the second trench 214 and the sidewalls of the first spacer layers 212. Forming the second spacer layers 216 involves forming a nitride layer on the entire surface of the silicon substrate 200 by LPCVD and etching-back the nitride layer by ion etching.

Figure 2F:
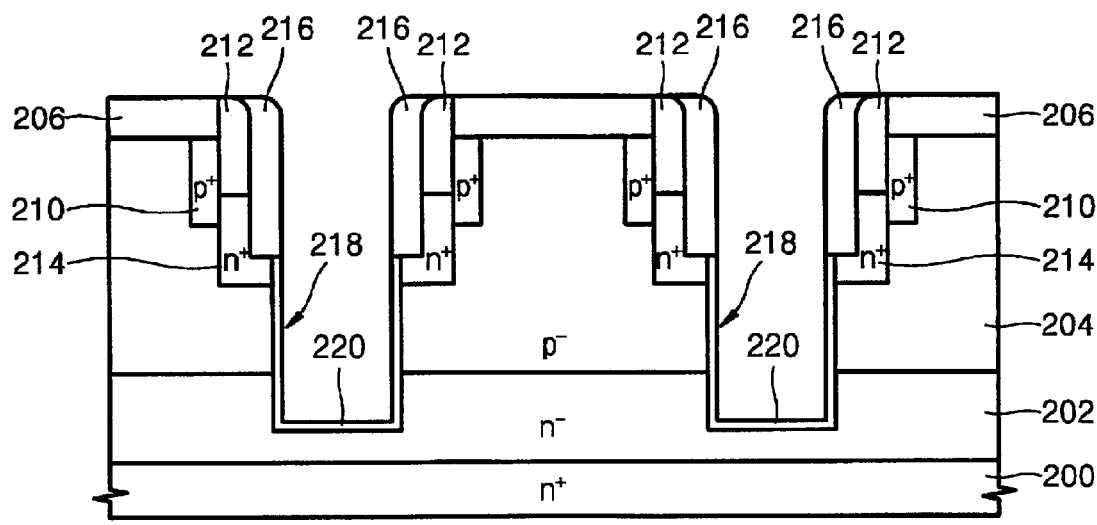

Referring to FIG. 2F, the second trench 214 is etched using the silicon oxide layer pattern 206, the first spacer layers 212, and the second spacer layers 216 as etching masks, thereby forming a third trench 218. Here, the third trench 218 is formed to a predetermined depth of the $n^-$-type epitaxial layer 202, perforating the $p^-$-type body region 204. Next, a gate oxide layer 220 is formed to a thickness of about 500 Å at the sidewalls of the third trench 218 by dry oxidization.

Figure 2G:
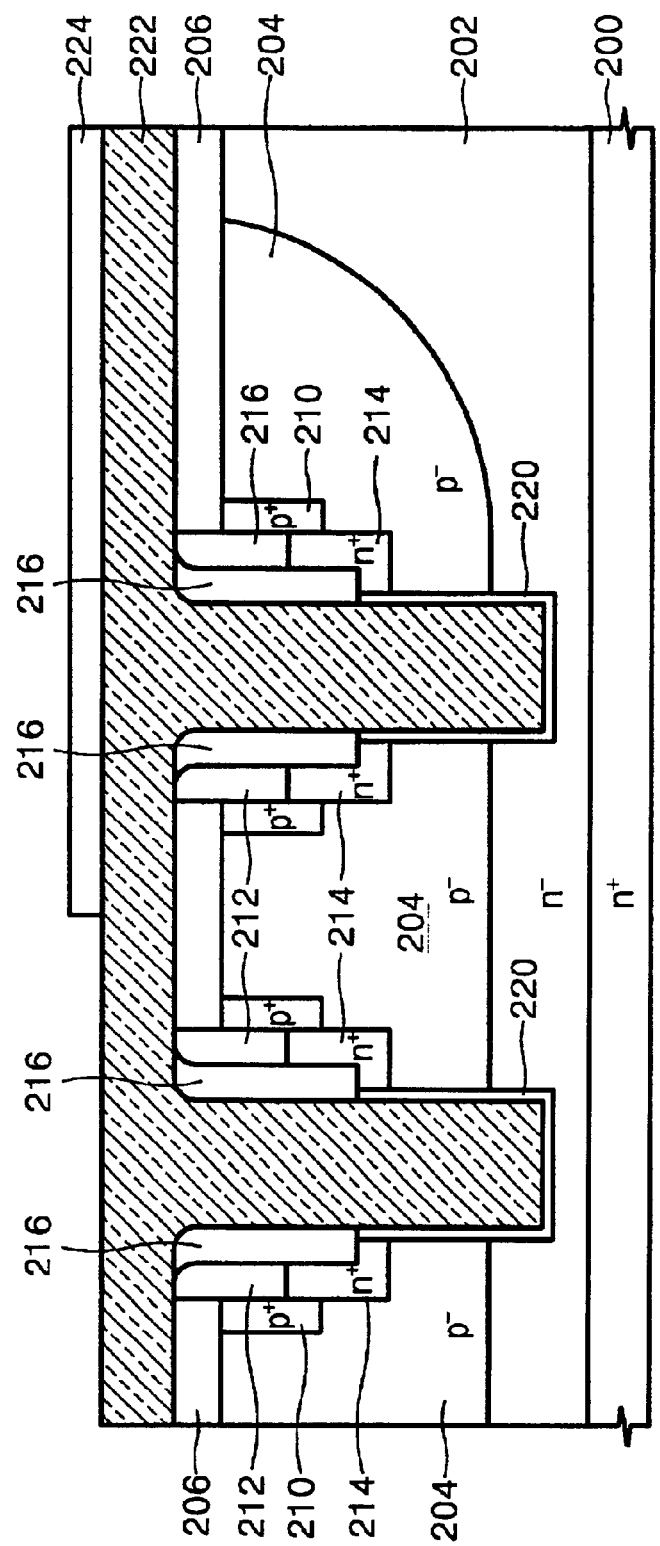

Referring to FIG. 2G, a polysilicon layer 222 doped with $POCl_3$ is deposited on the silicon substrate 200. The polysilicon layer 222 is formed to completely fill the third trench 218 and cover the top surfaces of the silicon oxide layer pattern 206, the first spacer layers 212, and the second spacer layers 216. Next, a nitride layer pattern 224 is formed on the polysilicon layer 222. Forming the nitride layer pattern 224 involves forming a nitride layer to a thickness of about 1600 Å on the polysilicon layer 222 by LPCVD, forming a second mask layer pattern (not shown) on the nitride layer, and etching the nitride layer using the second mask layer pattern as an etching mask. The nitride layer pattern 224 has an opening through, which the surface of the polysilicon layer 222 except for the edge of the polysilicon layer 222, i.e., a predetermined portion of the polysilicon layer 222, on which an electrode wiring line will be formed, is exposed.

Figure 2H:
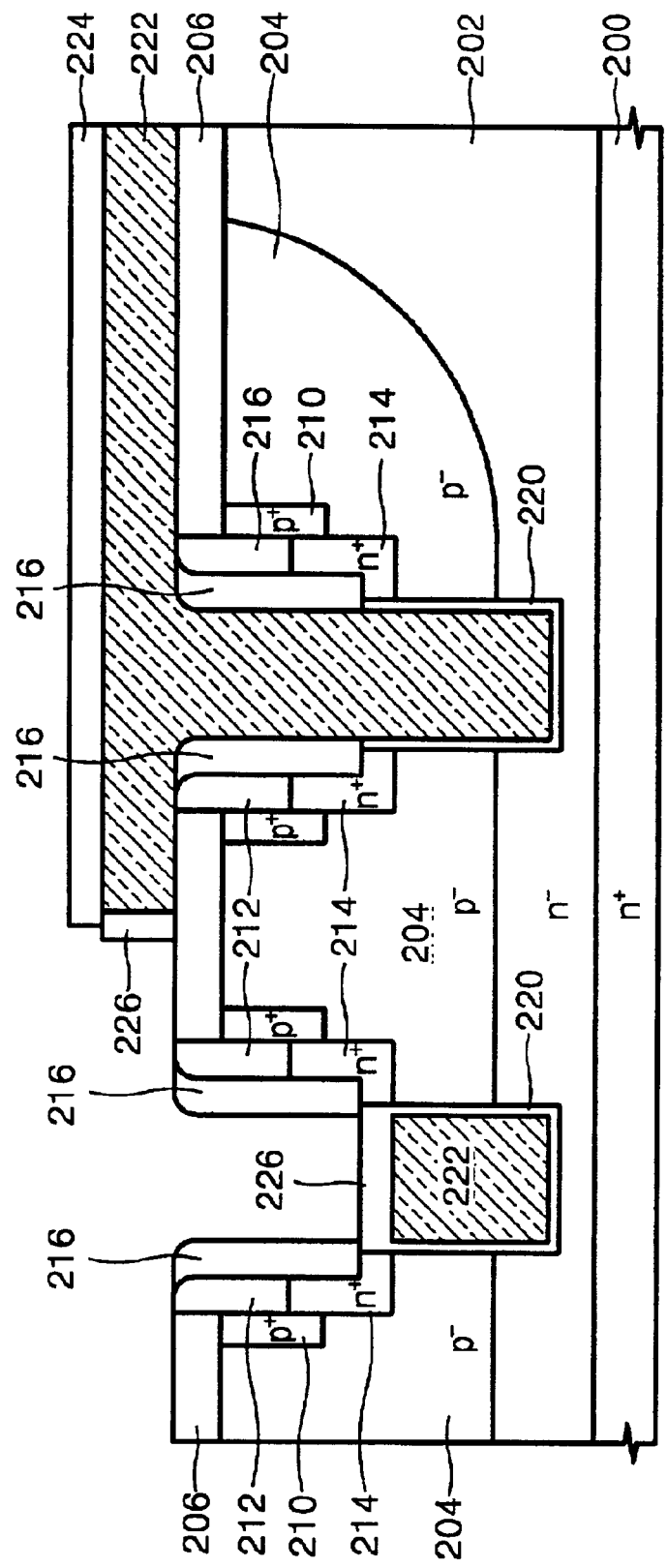
Figure 2I:
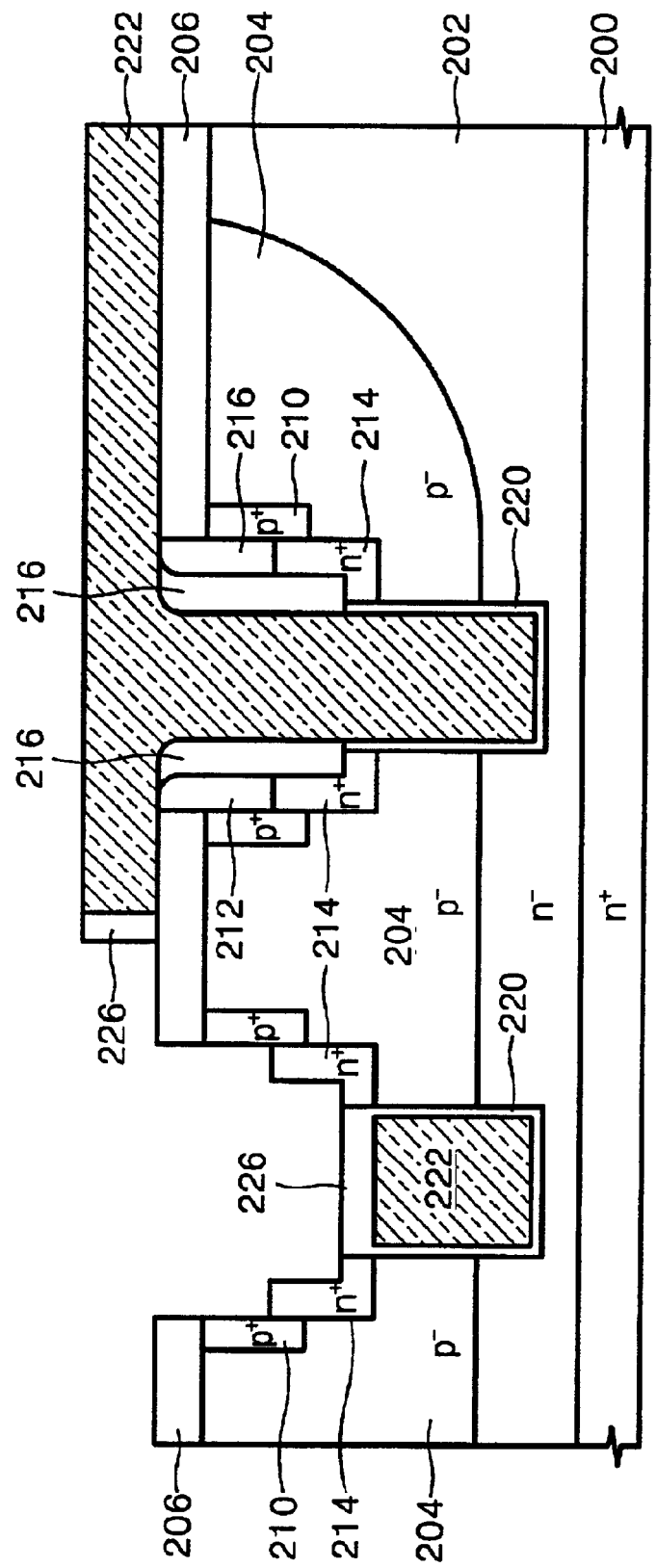
Figure 2J:
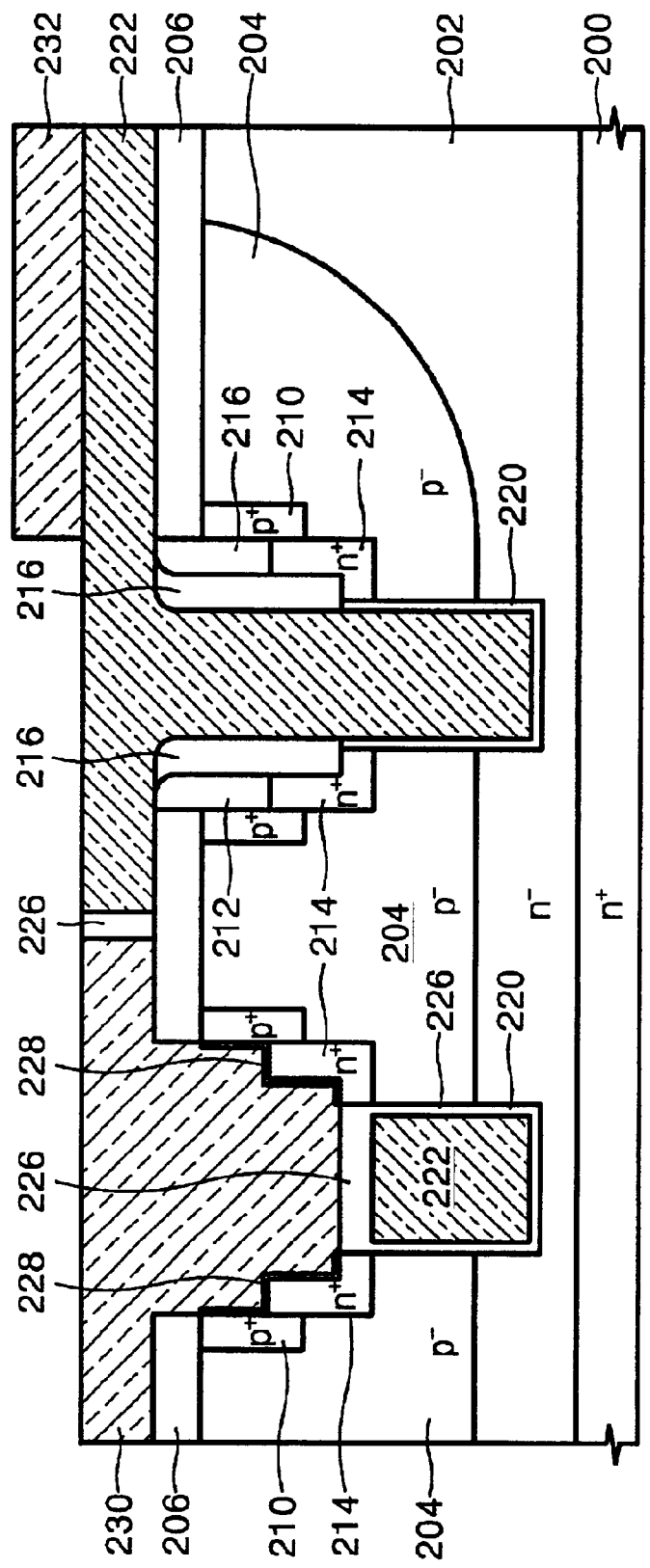

Referring to FIG. 2H, the exposed portions of the polysilicon layer 222 are etched back using the nitride layer pattern 224 as an etching mask by plasma ion etching to leave only a predetermined portion of the polysilicon layer 222. The remaining portion of the polysilicon layer 222 serves as a gate conductive layer pattern surrounded by the gate oxide layer 220 in the third trench 218 and having a top surface lower than the bottom surface of the $n^+$-type source region 214. Next, the silicon substrate 200 is heat-treated in an oxygen atmosphere, thereby forming a poly oxide layer 226 on the polysilicon layer 222 serving as a gate conductive layer pattern. The poly oxide layer 226 is also formed at a side of the polysilicon layer 222 serving as a gate electrode wiring line Referring to FIG. 2I, the nitride layer pattern 224, the second spacer layers 216, and the first spacer layers 212 are removed by etching so that the surfaces of the $p^+$-type body contact region 210 and the $n^+$-type source region 214 are partially exposed. Next, a metal silicide layer 228 is formed at the exposed surfaces of the $p^+$-type body contact region 210 and the $n^+$-type source region 214 by a typical silicidation process. Next, a metal layer, for example, an aluminum layer is formed on the entire surface of the silicon substrate 200. Next, the metal layer is etched using a third mask layer pattern (not shown) as an etching mask, thereby forming a source electrode 230 and a gate electrode 232 to be isolated from each other. The source electrode 230 is electrically connected to the p+-type body contact region 210 and the n+-type source region 214 through the metal silicide layer 228, and the gate electrode 232 is electrically connected to the polysilicon layer 222. The source electrode 230 and the gate electrode 232 are insulated from each other by the poly oxide layer 226. A metal layer (not shown) is also formed at the bottom surface of the silicon substrate 200 to form a drain electrode (not shown).

Until now, the present invention has been described above with an n-channel power semiconductor device as an example. However, it is quite clear to those skilled in the art that the present invention can also be applied to a method for fabricating a p-channel power semiconductor device. In other words, it is possible to apply the present invention to a method for fabricating a p-channel power semiconductor device by changing elements that have been described above as being an n-type conductivity type into elements of a p-type conductivity type, and changing elements that have been described above as being a p-type conductivity type into elements of an n-type conductivity type.

As described above, in the method for fabricating a power semiconductor device having a trench gate structure according to the present invention, since spacer layers and a trench are repeatedly formed in a self-alignment manner, it is possible to minimize the area occupied by a source region and a body contact region. Accordingly, the integration density of cells increases, and it is possible to manufacture a power semiconductor device having improved current driving ability and resistive characteristics. In addition, this method requires a smaller number of mask layer patterns (only 3 mask layer patterns) than the prior art (4 mask layer patterns).

What is claimed is:

1. A method for fabricating a power semiconductor device comprising:

sequentially forming an epitaxial layer of a first conductivity type having a low concentration and a body region of a second conductivity type on a semiconductor substrate of the first conductivity type having a high concentration;

forming an oxide layer pattern on the body region;

forming a first trench using the oxide layer pattern as an etching mask to perforate a predetermined portion of the body region having a first thickness;

forming a body contact region of the second conductivity type having a high concentration to surround the first trench by impurity ion implantation using the oxide layer pattern as an ion implantation mask;

forming first spacer layers to cover the sidewalls of the first trench and the sidewalls of the oxide layer pattern;

forming a second trench using the oxide layer pattern and the first spacer layers as etching masks to perforate a predetermined portion of the body region having a second thickness greater than the first thickness;

forming a source region of the first conductivity type having a high concentration to surround the second trench by impurity ion implantation using the oxide layer pattern and the first spacer layers as ion implantation masks;

forming second spacer layers to cover the sidewalls of the second trench and the sidewalls of the first spacer layers;

forming a third trench to a predetermined depth of the epitaxial layer using the oxide layer pattern, the first spacer layers, and the second spacer layers as etching masks;

forming a gate insulating layer in the third trench;

forming a gate conductive pattern in the gate insulating layer;

forming an oxide layer on the gate conductive layer pattern;

removing the first and second spacer layers;

forming a first metal electrode layer to be electrically connected to the source region and the body contact region;

forming a second metal electrode layer to be electrically connected to the gate conductive layer pattern; and forming a third metal electrode layer to be electrically connected to the semiconductor substrate.

2. The method of claim 1, wherein the silicon oxide layer pattern is formed to a thickness of about 4500 Å at a temperature of about 1000° C.

3. The method of claim 1, wherein forming the first spacer layers comprises:

forming a material layer to cover the first trench and the silicon oxide layer pattern; and etching back the material layer.

4. The method of claim 1, wherein forming the second spacer layers comprises:

forming a material layer to cover the second trench, the first spacer layers, and the silicon oxide layer pattern; and etching back the material layer.

5. The method of claim 3 or 4, wherein the material layer used to form the first or second spacer layers is a nitride layer.

6. The method of claim 3 or 4, wherein the material layer used to form the first or second spacer layers is formed by low pressure chemical vapor deposition.

7. The method of claim 3 or 4, wherein etching the material layer is performed by plasma ion etching.

8. The method of claim 1, wherein the first conductivity type is an n-type, and the second conductivity type is a p-type.

9. The method of claim 1, wherein the first conductivity type is a p-type, and the second conductivity type is an n-type.

* * * * *